US008890630B2

(12) United States Patent
Hughes

(10) Patent No.: US 8,890,630 B2
(45) Date of Patent: Nov. 18, 2014

(54) OSCILLATOR APPARATUS AND METHOD WITH WIDE ADJUSTABLE FREQUENCY RANGE

(75) Inventor: Rodney Alan Hughes, Tacoma, WA (US)

(73) Assignee: Crane Electronics, Inc., Redmond, WA (US)

( * ) Notice: Subject to any disclaimer, the term of this patent is extended or adjusted under 35 U.S.C. 154(b) by 72 days.

(21) Appl. No.: 13/185,152

(22) Filed: Jul. 18, 2011

(65) Prior Publication Data

US 2013/0021108 A1 Jan. 24, 2013

(51) Int. Cl.
| | |
|---|---|
| *H03K 3/02* | (2006.01) |
| *H03B 5/24* | (2006.01) |
| *H03K 3/354* | (2006.01) |
| *H03B 5/04* | (2006.01) |
| *H03K 3/0231* | (2006.01) |
| *H03K 4/12* | (2006.01) |

(52) U.S. Cl.
CPC .......... *H03B 5/24* (2013.01); *H03B 2200/0074* (2013.01); *H03K 3/354* (2013.01); *H03B 5/04* (2013.01); *H03K 3/0231* (2013.01); *H03K 4/12* (2013.01)
USPC ................... 331/143; 331/108 D; 331/108 R; 331/111; 331/145; 331/149; 331/153

(58) Field of Classification Search
CPC ....... H03K 3/0231; H03K 4/12; H03K 3/354; H03B 5/24; H03B 5/04; H03B 2200/0074
USPC .......... 331/108 D, 108 R, 111, 143, 145, 149, 331/153
See application file for complete search history.

(56) References Cited

U.S. PATENT DOCUMENTS

| | | | |
|---|---|---|---|
| 4,128,868 A | | 12/1978 | Gamble |
| 4,635,002 A | * | 1/1987 | Riebeek .................... 331/108 R |

(Continued)

FOREIGN PATENT DOCUMENTS

| | | |
|---|---|---|
| CN | 103582997 A | 2/2014 |
| JP | 2001-320250 A | 11/2001 |

(Continued)

OTHER PUBLICATIONS

"Application Guide: Theory of Operation," MicroPower Direct, URL= http://micropowerdirect.com/PDF%20Files/Application%20Notes/Power%20Supply%20Theory%20of%20Operation.pdf, download date Apr. 18, 2012, 6 pages.

(Continued)

*Primary Examiner* — Arnold Kinkead
*Assistant Examiner* — Richard Tan
(74) *Attorney, Agent, or Firm* — Seed Intellectual Property Law Group PLLC

(57) ABSTRACT

An oscillator formed from low cost discrete semiconductors and passive devices creates a linear periodic ramp of constant frequency with ramp slope based on an external voltage signal. Parameters are stable over a wide range of temperatures and variations of transistor parameters that normally degrade in extreme environments. The oscillator period can be phase and frequency synchronized to an external clock source over a wide range of frequencies. The oscillator ramp generator phase can be synchronized on a cycle by cycle basis for incorporation in power converters employing spread spectral EMI reduction techniques, multi-converter systems employing clock interleaving for distribution bus filter optimization, and resonant mode converters employing zero voltage switching techniques. Oscillator ramp rate is independent of frequency and can be synchronized to DC (inhibit) for use in ultra low power burst mode power conversion.

15 Claims, 5 Drawing Sheets

(56) References Cited

U.S. PATENT DOCUMENTS

| | | | |
|---|---|---|---|
| 4,743,835 A | 5/1988 | Bossé et al. | |
| 4,992,919 A | 2/1991 | Lee et al. | |
| 5,148,357 A | 9/1992 | Paice | |
| 5,418,502 A * | 5/1995 | Ma et al. | 331/111 |
| 5,430,640 A | 7/1995 | Lee | |
| 5,481,225 A | 1/1996 | Lumsden et al. | |
| 5,521,807 A | 5/1996 | Chen et al. | |
| 5,631,822 A | 5/1997 | Silberkleit et al. | |
| 5,638,262 A | 6/1997 | Brown | |
| 5,694,303 A | 12/1997 | Silberkleit et al. | |
| 5,774,347 A | 6/1998 | Nakanishi | |
| 5,903,504 A | 5/1999 | Chevallier et al. | |
| 6,043,705 A | 3/2000 | Jiang | |
| 6,137,373 A * | 10/2000 | Mori | 331/145 |
| 6,157,180 A | 12/2000 | Kuo | |
| 6,335,872 B1 | 1/2002 | Zhou et al. | |
| 6,343,026 B1 | 1/2002 | Perry | |
| 6,456,511 B1 | 9/2002 | Wong | |
| 6,472,852 B1 | 10/2002 | Lethellier | |
| 6,545,534 B1 | 4/2003 | Mehr | |
| 6,643,151 B1 | 11/2003 | Nebrigic et al. | |
| 6,697,955 B1 | 2/2004 | Malik et al. | |
| 6,850,048 B2 | 2/2005 | Orr et al. | |
| 6,998,901 B2 * | 2/2006 | Lee | 327/536 |
| 7,061,212 B2 | 6/2006 | Phadke | |
| 7,183,727 B2 | 2/2007 | Ferguson et al. | |
| 7,206,210 B2 | 4/2007 | Harnett et al. | |
| 7,286,376 B2 | 10/2007 | Yang | |
| 7,304,828 B1 | 12/2007 | Shvartsman | |
| 7,339,804 B2 | 3/2008 | Uchida | |
| 7,515,005 B2 * | 4/2009 | Dan | 331/57 |
| 7,564,706 B1 | 7/2009 | Herbert | |
| 7,577,539 B2 | 8/2009 | Hubanks et al. | |
| 7,579,901 B2 * | 8/2009 | Yamashita | 327/536 |
| 7,602,273 B2 | 10/2009 | Yoshikawa | |
| 7,730,981 B2 | 6/2010 | McCabe et al. | |
| 7,742,318 B2 | 6/2010 | Fu et al. | |
| 7,847,519 B2 | 12/2010 | Ho | |
| 7,884,317 B2 | 2/2011 | Casper | |
| 8,040,699 B2 | 10/2011 | Huynh et al. | |
| 8,067,992 B2 * | 11/2011 | Chen et al. | 331/111 |
| 8,358,118 B2 | 1/2013 | Chen et al. | |
| 8,520,415 B1 | 8/2013 | Krishnamoorthy et al. | |
| 8,552,589 B2 | 10/2013 | Ghosh et al. | |
| 8,649,128 B2 | 2/2014 | Wang et al. | |
| 2002/0015320 A1 | 2/2002 | Mochikawa et al. | |
| 2002/0071300 A1 | 6/2002 | Jang et al. | |
| 2004/0125523 A1 | 7/2004 | Edwards et al. | |
| 2006/0039172 A1 | 2/2006 | Soldano | |
| 2006/0132105 A1 | 6/2006 | Prasad et al. | |
| 2006/0212138 A1 | 9/2006 | Zhang | |
| 2006/0220629 A1 | 10/2006 | Saito et al. | |
| 2008/0031014 A1 | 2/2008 | Young | |
| 2009/0067206 A1 | 3/2009 | Oguchi et al. | |
| 2009/0167432 A1 | 7/2009 | van den Heuvel | |
| 2009/0174381 A1 | 7/2009 | Ojanen et al. | |
| 2009/0237057 A1 | 9/2009 | Dishman et al. | |
| 2009/0256547 A1 | 10/2009 | Akyildiz et al. | |
| 2009/0273431 A1 | 11/2009 | Hurst | |
| 2009/0302775 A1 | 12/2009 | Alexandrov | |
| 2010/0014330 A1 | 1/2010 | Chang et al. | |
| 2010/0117715 A1 * | 5/2010 | Ariyama | 327/512 |
| 2010/0176755 A1 | 7/2010 | Hoadley et al. | |
| 2010/0253309 A1 | 10/2010 | Xi et al. | |
| 2011/0169471 A1 | 7/2011 | Nagasawa | |
| 2011/0241637 A1 | 10/2011 | Parker | |
| 2013/0245854 A1 | 9/2013 | Rinne et al. | |
| 2014/0016356 A1 | 1/2014 | Furmanczyk et al. | |
| 2014/0070887 A1 | 3/2014 | Lam et al. | |

FOREIGN PATENT DOCUMENTS

| | | | |
|---|---|---|---|
| JP | 2002-076799 A | | 3/2002 |
| JP | 2007-263944 A | | 10/2007 |
| JP | 5030216 B2 | | 9/2012 |
| KR | 2008-019196 A | | 3/2008 |
| KR | 2008-101784 A | | 11/2008 |
| WO | 2011/123680 A2 | | 10/2011 |
| WO | 2012/116263 A1 | | 8/2012 |
| WO | 2014/039982 A1 | | 3/2014 |

OTHER PUBLICATIONS

"Buck converter," URL= http://en.wikipedia.org/wiki/Buck_converter, download date Jun. 23, 2011, 14 pages.

"Maximum Flexible Power (MFP) Single Output Point of Load: Technical Preview—3—6 VDC in, 7 Amp, Non-Isolated DC/DC Converter," Crane Aerospace & Electronics Power Solutions, 2010, 17 pages.

"Step-gap "E" core swing chokes: Improved regulation and higher efficiency are possible when operating at minimum current levels," Technical Bulletin: Bulletin FC-S4, Magnetics Division, Spang & Company, Butler, Pennsylvania, 2001, 4 pages.

"Synchronous Rectification Aids Low-Voltage Power Supplies," Maxim Integrated Products, URL= http://www.maxim-ic.com/app-notes/index.mvp/id/652, download date Jun. 22, 2011, 6 pages.

Hughes et al., "Self Synchronizing Power Converter Apparatus and Method Suitable for Auxiliary Bias for Dynamic Load Applications," U.S. Appl. No. 13/185,217, filed Jul. 18, 2011, 44 pages.

Hume et al., "Power Converter Apparatus and Method With Compensation for Light Load Conditions," U.S. Appl. No. 13/185,142, filed Jul. 18, 2011, 31 pages.

Waltman et al., "Input Control Apparatus and Method With Inrush Current, Under and Over Voltage Handling," U.S. Appl. No. 13/185,210, filed Jul. 18, 2011, 41 pages.

Waltman et al., "Power Converter Apparatus and Method With Compensation for Current Limit/Current Share Operation," U.S. Appl. No. 13/185,172, filed Jul. 18, 2011, 45 pages.

Waltman et al., "Power Converter Apparatus and Methods," U.S. Appl. No. 61/508,937, filed Jul. 18, 2011, 139 pages.

Hume et al., "Power Converter Apparatus and Method With Compensation for Light Load Conditions," Office Action mailed Nov. 6, 2013, for U.S. Appl. No. 13/185,142, 11 pages.

International Search Report, mailed Oct. 14, 2011, for PCT/US2011/030778, 3 pages.

Kristjansson et al., "Solutions to Today's Low Voltage Power Design Challenges Using High-Efficiency, Non-Isolated Point of Load Converters: A Discussion of the Interpoint™ MFP Series™ Point of Load Converter," Crane Aerospace & Electronics, Power Solutions—Interpoint Products, Redmond, WA, Oct. 2011, Revised Jan. 2012, 25 pages.

Merriam-Webster, "Directly," retrieved from http://www.merriam-webster.com/dictionary/directly, on Nov. 6, 2012, 1 page.

Xing et al., "Power System Architecture with Back-Up Power for Servers," ERC Program of the National Science Foundation, 5 pages, Dec. 20, 2009; available at: http://www.docstoc.com/docs/19892020/power-system-architecture-with-back-up-power-for-servers (which is the only date could be traced by Applicant related to the publication).

Office Action, dated Dec. 17, 2013, for Corresponding U.S. Appl. No. 13/185,172, 15 pages.

eCircuit Center, "Op Amp Offset Adjustment," 2002, retrieved from http://www.ecircuitcenter.com/Circuits/op_voff/op_voff2.htm on Mar. 26, 2012, 3 pages.

eCircuit Center, "Op Amp Offset Voltage," 2002, retrieved from http://www.ecircuitcenter.com/Circuits/op_voff/op_voff.htm on Mar. 26, 2012, 3 pages.

International Search Report, mailed Dec. 20, 2013, for PCT/US2013/057874, 3 pages.

Lam et al., "Impedance Compensation for Operational Amplifiers Used in Variable Environments," Office Action mailed Feb. 7, 2014, for U.S. Appl. No. 13/609,107, 11 pages.

Nguyen et al., "Nulling Input Offset Voltage of Operational Amplifiers," Mixed Signal Products, Texas Instruments—Application Report SLOA045, Aug. 2000, pp. 1-15.

(56) References Cited

OTHER PUBLICATIONS

Parker, "Switched Capacitor Hold-Up Scheme for Constant Boost Output Voltage," Office Action mailed Mar. 28, 2012, for U.S. App. No. 12/751,067, 16 pages.
Parker, "Switched Capacitor Hold-Up Scheme for Constant Boost Output Voltage," Amendment filed Jul. 30, 2012, for U.S. Appl. No. 12/751,067, 18 pages.
Parker, "Switched Capacitor Hold-Up Scheme for Constant Boost Output Voltage," Office Action mailed Nov. 16, 2012, for U.S. Appl. No. 12/751,067, 20 pages.
Parker, "Switched Capacitor Hold-Up Scheme for Constant Boost Output Voltage," Amendment filed Jan. 16, 2013, for U.S. Appl. No. 12/751,067, 15 pages.
Parker, "Switched Capacitor Hold-Up Scheme for Constant Boost Output Voltage," Amendment filed Feb. 15, 2013, for U.S. Appl. No. 12/751,067, 15 pages.
Parker, "Switched Capacitor Hold-Up Scheme for Constant Boost Output Voltage," Office Action mailed Jul. 30, 2013, for U.S. Appl. No. 12/751,067, 18 pages.
Parker, "Switched Capacitor Hold-Up Scheme for Constant Boost Output Voltage," Amendment filed Oct. 30, 2013, for U.S. Appl. No. 12/751,067, 19 pages.
Parker, "Switched Capacitor Hold-Up Scheme for Constant Boost Output Voltage," Notice of Allowance mailed Feb. 3, 2014, for U.S. Appl. No. 12/751,067, 11 pages.
Waltman et al., "Power Converter Apparatus and Method With Compensation for Current Limit/Current Share Operation," Amendment filed Mar. 17, 2014, for U.S. Appl. No. 13/185,172, 16 pages.
Written Opinion, mailed Oct. 14, 2011, for PCT/US2011/030778, 5 pages.
Written Opinion, mailed Dec. 20, 2013, for PCT/US2013/058784, 4 pages.
Hughes et al., "Self Synchronizing Power Converter Apparatus and Method Suitable for Auxiliary Bias for Dynamic Load Applications," Notice of Allowance mailed May 14, 2014, for U.S. Appl. No. 13/185,217, 10 pages.
Lam et al., "Impedance Compensation for Operational Amplifiers Used in Variable Environments," Amendment filed May 6, 2014, for U.S. Appl. No. 13/609,107, 12 pages.
Ng, "Implementing Constant Current Constant Voltage AC Adapter by NCP1200 and NCP4300A," ON Semiconductor, Application Note, Publication Order No. AND8042/D, Feb. 2001, 12 pages.
Pascu, "Error Amplifier with Forced Equilibrium Adaptor," Kepco, Inc., retrieved from http://www.kepcopower.com/equibm2.htm#fig2, dated May 22, 2014, 8 pages.
Waltman et al., "Power Converter Apparatus and Method With Compensation for Current Limit/Current Share Operation," Notice of Allowance mailed May 8, 2014, for U.S. Appl. No. 13/185,172, 10 pages.
Lam et al., "Impedance Compensation for Operational Amplifiers Used in Variable Environments," Notice of Allowance mailed Jun. 27, 2014, for U.S. Appl. No. 13/609,107, 9 pages.
Waltman et al., "Input Control Apparatus and Method With Inrush Current, Under and Over Voltage Handling," Office Action mailed Jun. 17, 2014, for U.S. Appl. No. 13/185,210, 8 pages.

* cited by examiner

OSCILLATOR APPARATUS AND METHOD WITH WIDE ADJUSTABLE FREQUENCY RANGE

BACKGROUND

1. Technical Field

This disclosure is generally related to oscillators, which may, for example, be employed in power converters and other devices.

2. Description of the Related Art

Power converters are used to transform electrical energy, for example converting between alternating current (AC) and direct current (DC), adjusting (e.g., stepping up, stepping down) voltage levels and/or frequency.

Power converters take a large variety of forms. One of the most common forms is the switched-mode power converter or supply. Switched-mode power converters employ a switching regulator to efficiently convert voltage or current characteristics of electrical power. Switched-mode power converters typically employ a storage component (e.g., inductor, transformer, capacitor) and a switch that quickly switches between full ON and full OFF states, minimizing losses. Voltage regulation may be achieved by varying the ratio of ON to OFF time or duty cycle. Various topologies for switched-mode power converters are well known in the art including non-isolated and isolated topologies, for example boost converters, buck converters, synchronous buck converters, buck-boost converters, and fly-back converters.

In the interest of efficiency, digital logic technology is employing ever lower voltage logic levels. This requires power converters to deliver the lower voltages at higher currents level. To meet this requirement, power converters are employing more energy efficient designs. Power converters are also increasingly being located in close proximity to the load in as point of load (POL) converters in a POL scheme. These power converters must generate very low voltage or potential levels (e.g., less than 1V) at increasingly higher current levels (e.g., greater than 10 A). These relatively high current levels may be difficult to achieve with a single power converter.

Manufacturers are also increasingly employing POL schemes in light of the widely varying voltage requirements in modern systems (e.g., computer systems). A POL scheme may be easier to design and/or fabricate, take up less area, and/or produce less interference than employing multiple different power buses. The POL schemes typically employ one or two power buses with a number of POL regulators located close to specific components or subsystems to be powered, for example microprocessors, field programmable gate arrays (FPGAs), application specific integrated circuits (ASICs), volatile memory. The POL regulators adjust voltage or potential to supply localized busses feeding the specific components or subsystems.

Switched mode power converters typically include an oscillator or oscillator circuit which generates, provides or supplies a periodic, oscillating ramp voltage waveform to a gate timing and drive control for use in generating pulse width modulated control signals for controlling one or more switches of the converter circuit. It is desirable that the oscillator provide a linear ramp signal with ramp voltage rate of change (dv/dt) rate proportional to the supply input voltage while maintaining a fixed frequency over a wide range of frequencies and over a wide range of temperatures. Additionally, the oscillator may need to be synchronized with other oscillating waveforms and other frequencies, for example those from a system clock or another power converter. Further, it is typically desirable that the oscillator is relatively inexpensive to manufacture.

New approaches to related to oscillation circuits are desirable.

BRIEF SUMMARY

The approaches described herein to generate a periodic ramp oscillator signal may advantageously provide one or more of: 1) the oscillator is self oscillating and requires no start up input; 2) the slope of the ramp is modulated by an external signal and is linear over a wide range of operating conditions of input signal range & temperature; 3) the oscillator signal output can be synchronized to an external clock signal input; 4) the oscillator signal output synchronizes to the external signal input up to two times the self oscillation frequency of the oscillator; and/or 5) method uses less complex, lower cost discrete semiconductor components, chip resistors and capacitors.

In contrast, existing approaches utilize more costly and complex integrated circuit devices, such as comparators/operational amplifiers with additional components or a custom designed complex integrated circuit. Existing approaches appear to lack all the features described above. Existing approaches also appear to fail to operate over an ultra wide synchronous frequency range and temperature range as desired, with external slope modulation of the ramp oscillator signal. Existing approaches use terrestrial technology.

An oscillator ramp generator may be summarized as including a voltage input terminal to receive an input voltage signal; a synchronizing signal input terminal to receive a synchronizing signal; a ramp timing resistance; a ramp timing capacitor which is charged by the input voltage signal through the ramp timing resistance; an input voltage resistor divider network coupled to the voltage input terminal and which produces a discharge trigger reference voltage that is proportional to a voltage of the input voltage signal; a comparator that compares a voltage across the ramp timing capacitor to the discharge trigger reference voltage; and a logic circuit that in response to a first state of a synchronization signal, discharges the ramp timing capacitor and that in response to a second state of the synchronization signal when the value of the voltage across the ramp timing capacitor is equal to the discharge trigger reference voltage, delays a discharging of the ramp timing capacitor.

The input voltage resistor divider network may include a first divider resistor and a second divider resistor, the input voltage resistor network coupled to provide the discharge trigger reference voltage the comparator. The input voltage resistor divider network may further include a temperature compensation resistor to compensate the discharge trigger reference voltage for temperature variation. The comparator may include a first comparator transistor and a second comparator transistor coupled as a differential pair of transistors, with a base of the first comparator transistor coupled as an inverting input to the input voltage resistor divider network to receive the discharge trigger reference voltage and a base of the second comparator transistor coupled as a non-inverting input to the ramp timing capacitor to receive the voltage across the ramp timing capacitor. The comparator may include a first comparator transistor and a second comparator transistor coupled as a differential pair of transistors.

The oscillator may further include a control transistor; a discharge controlling capacitor; a discharge termination transistor and a discharge controlling transistor, the control transistor responsive to at least an output of the comparator to selectively charge the discharge controlling capacitor from the voltage input terminal, the discharge controlling capacitor coupled to selectively cause the discharge controlling transistor and the discharge termination transistor to discharge the ramp timing capacitor. The discharge controlling transistor may selectively provide a path to a ground to at least approximately fully discharge the ramp timing capacitor to at least close to a zero voltage. The logic circuit may include: a synchronization capacitor coupled to the synchronization input terminal to receive the synchronization signal, a first diode coupled to cause the control transistor to be in a first state (e.g., ON) in response to a first state (e.g., rising edge of a pulse) of the synchronization signal and a second diode coupled to the control transistor cause the control transistor to be in a second state (e.g., OFF) in response to a second state (e.g., low level pulse) of the synchronization signal.

The oscillator may further include a level shifting diode electrically coupling a control transistor resistor to a ground to level shift the control transistor resistor reducing a voltage required to turn on the control transistor. The ramp timing resistance may include a first ramp resistor and a second ramp resistor electrically coupled in series with the first ramp resistor between the voltage input terminal and the ramp timing capacitor.

The oscillator may further include a buffer transistor; and a buffer resistor, the buffer transistor and buffer resistor coupled to form an emitter follower buffer amplifier between a voltage supply and a ground to provide a low source impedance driver. At least the comparator and the logic circuit may each be formed of a number of discrete semiconductor components.

A method of operating an oscillator may be summarized as including receiving an input voltage signal at a voltage input terminal; receiving a synchronizing signal at a synchronizing signal input terminal; charging a ramp timing capacitor via the input voltage signal through a ramp timing resistance; producing a discharge trigger reference voltage that is proportional to a voltage of the input voltage signal; in response to a value of a voltage across the ramp timing capacitor being equal to the discharge trigger reference voltage, discharging the ramp timing capacitor if a state of the synchronization signal indicates synchronization and delaying discharging of the ramp timing capacitor if the state of the synchronization signal does not indicate synchronization; and in response to the state of the synchronization signal indicating synchronization while the voltage across the ramp timing capacitor is less than the discharge trigger reference voltage, discharging the ramp timing capacitor.

Comparing the voltage across the ramp timing capacitor to the discharge trigger reference voltage may include supplying the discharge trigger reference voltage to a first transistor of a differential pair of transistors and supplying the voltage across the ramp timing capacitor to a second transistor of the differential pair of transistors.

The method may further include determining whether to trigger discharging of the ramp timing capacitor when the value of a voltage across the ramp timing capacitor is equal to the discharge trigger reference voltage. Determining whether to trigger discharging of the ramp timing capacitor when the value of a voltage across the ramp timing capacitor is equal to the discharge trigger reference voltage may include supplying the synchronization signal to a logic network comprising a synchronization capacitor, a first synchronization diode and a second synchronization diode, triggering the discharging of the ramp timing capacitor via the first synchronization diode in response to a first synchronization state and suppressing triggering of the discharging of the ramp timing capacitor via the second synchronization diode in response to a second synchronization state.

The method of may further include buffering an output voltage signal via a buffer amplifier. Buffering an output voltage signal via a buffer amplifier may include buffering the output voltage signal via an emitter follower buffer amplifier having a discrete transistor and resistor. Producing a discharge trigger reference voltage that is proportional to a voltage of the input voltage signal may include dividing the input voltage signal via an input voltage resistor divider network and temperature compensating the divided input voltage signal.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with power conversion topologies have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and the appended claims, references are made to a "node" or "nodes." It is understood that a node may be a pad, a pin, a junction, a connector, a wire, or any other point recognizable by one of ordinary skill in the art as being suitable for making an electrical connection within an integrated circuit, on a circuit board, in a chassis or the like.

The headings and Abstract of the Disclosure provided herein are for convenience only and do not interpret the scope or meaning of the embodiments.

Figure 1:
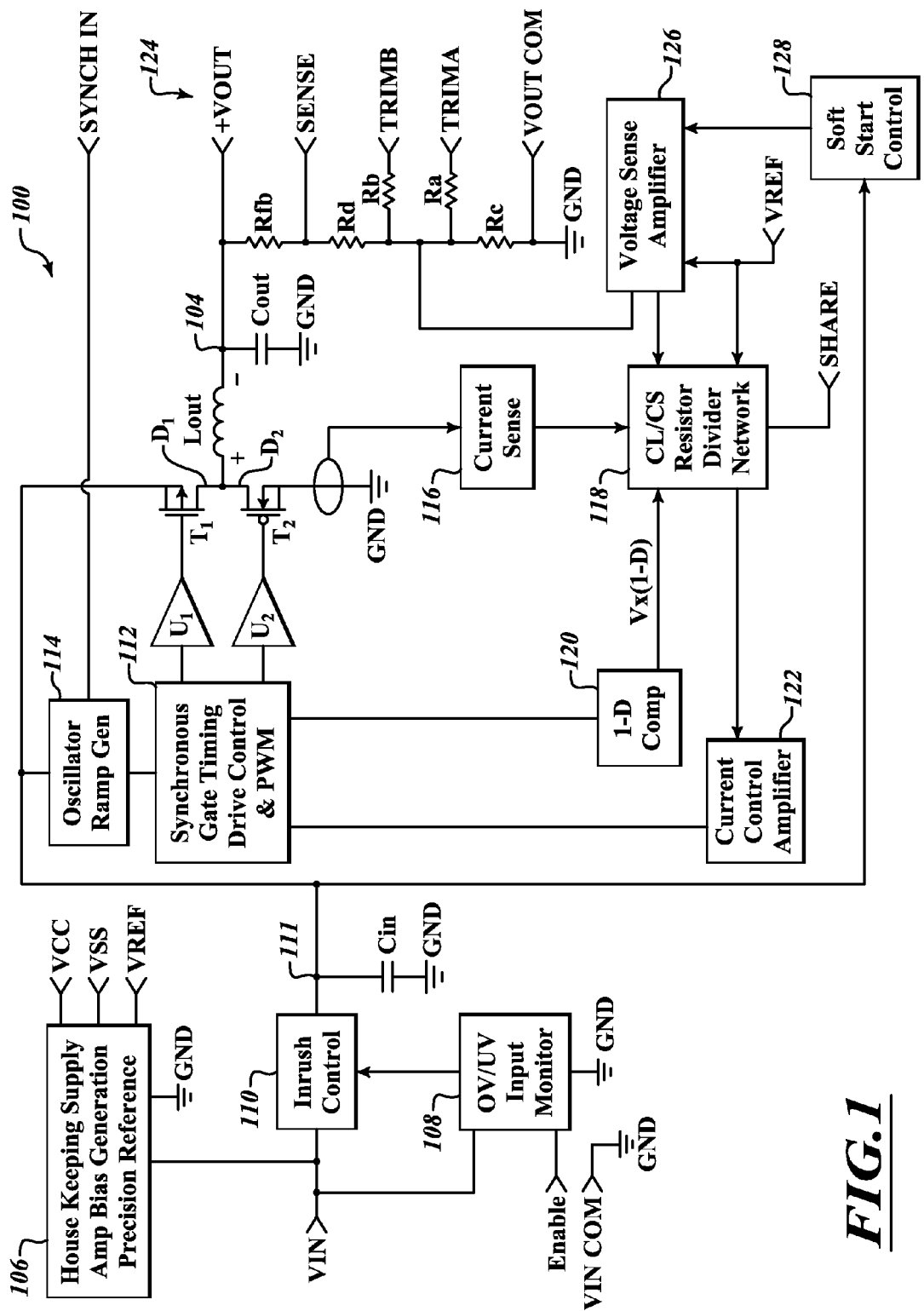
FIG. 1 is a schematic diagram of a power converter including a oscillator ramp circuit, according to one illustrated embodiment.

FIG. 1 shows a power converter 100, according to one illustrated embodiment. The description of FIG. 1 provides an overview of the structure and operation of the power converter 100, which structure and operation are described in further detail with reference to FIGS. 2-7.

The power converter 100 may, for example, take the form of a DC/DC power converter to convert (e.g., raise, lower) DC voltages. The power converter 100 may, for example, include an output inductor $L_{out}$ electrically coupled to an output terminal +VOUT, a first active switch (i.e., high side active switch) $T_1$ selectively operable to electrically couple the inductor $L_{out}$ to a voltage input terminal VIN. A second device $T_2$ electrically couples the output inductor $L_{out}$ to a ground GND which is in turn electrically coupled to a ground or common input terminal VIN COM and a ground or common output terminal VOUT COM.

As illustrated, the power converter 100 may advantageously take the form of a synchronous buck converter, operable to lower a DC voltage. Where implemented as a synchronous buck converter, the second device $T_2$ takes the form of a second active switch (i.e., high side active switch), selectively operable to electrically couple the output inductor Lout to ground GND. The power converter 100 may take forms other than a synchronous buck converter, for example a buck converter where the second device takes the form of a passive device, such as a diode (not shown).

The switches $T_1$, $T_2$ may take a variety of forms suitable for handling expected currents, voltages and/or power. For example, the switches $T_1$, $T_2$ make take the form of an active device, such as one or more metal oxide semiconductor field effect transistors (MOSFETs). As illustrated in the Figures, the first or high side switch $T_1$ may take the form of P-Channel MOSFET, while the second or low side switch $T_2$ make take the form of an N-Channel MOSFET. The output inductor Lout may be coupled via a node 102 to the drains $D_1$, $D_2$ of the MOSFET switches $T_1$, $T_2$ respectively. The power converter 100 may employ other types of switches, for example insulated gate bipolar transistors (IGBTs). While only one respective MOSFET is illustrated, each of the first and/or second switches $T_1$, $T_2$ may include two or more transistors electrically coupled in parallel.

The power converter 100 may include an output capacitor Cout electrically coupled between ground GND and a node 104 between the output inductor Lout and the output terminal +VOUT. Output capacitor Cout may smooth the output supplied to the output terminal +VOUT.

On an input side, the power converter 100 may include an auxiliary power supply and voltage reference generation block 106, an over voltage/under voltage monitor block 108 and/or an "in rush" current control block 110.

The auxiliary power supply and voltage reference generation block 106 implements a house keeping supply generation function, amplifier bias generation function and precision reference generation function, resulting in a positive supply voltage or potential VCC, a negative supply voltage or potential or ground VSS, and a precision reference voltage or potential VREF. The structure and operation of the auxiliary power supply and voltage reference generation block 106 can take any existing form, and is not a subject of this application so is not described in further detail.

The over voltage/under voltage monitor block 108 monitors instances of over voltage and/or under voltage conditions, supplying a control signal via a control line (not called out in FIG. 1) to the "in rush" current control block 110 as needed. The over voltage/under voltage monitor block 108 or other components may be triggered via an enable signal via an enable input terminal ENABLE. The "inrush" current control block 110 controls "inrush" current, directly limiting current to input capacitor(s) Cin, reducing electrical stresses on the power converter 100 and any system into which the power converter 100 is incorporated. Power converters 100 typically employ large internal bulk filter capacitors to filter the input power to reduce noise conducted out of the power converter 100, back upstream to the source of the input power. The input capacitor Cin is electrically coupled between ground GND and a node 111 between the "inrush" current control block 110 and the first active switch $T_1$. The "inrush" current control block 110 is configured to control the "inrush" current that flows to the input capacitor, particularly at initial application of the input voltage or potential VIN.

The structure and operation of the over voltage/under voltage monitor block 108, the "inrush" current control block 110, and the input capacitor(s) Cin may take any existing form, and are not subjects of this application so are not described in further detail.

Figure 2:
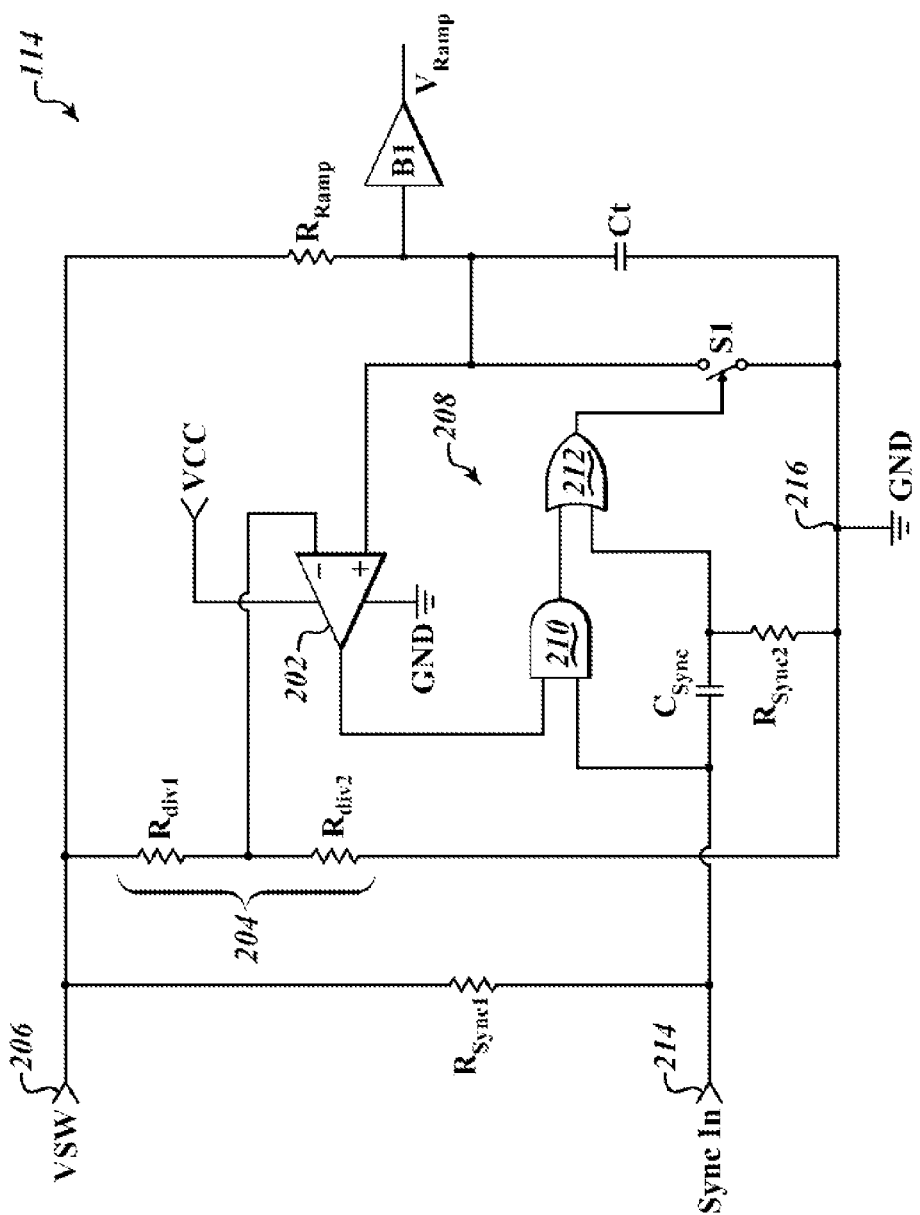
FIG. 2 is a functional block diagram of the oscillator circuit of FIG. 1, according to one illustrated embodiment.

Control of the converter circuit (e.g., synchronous buck converter) is realized via a number of components or assemblies, represented in FIGS. 1 and 2 as blocks.

The power converter 100 includes a synchronous gate timing drive control and pulse width modulation (PWM) block 112. The synchronous gate timing drive control and pulse width modulation block 112 generates gate control signals to control the switches $T_1$, $T_2$, for example via amplifiers $U_1$, $U_2$, respectively. The synchronous gate timing drive control and pulse width modulation block 112 may optionally receive a share signal via a share input terminal SHARE from one or more other power converters, for example when electrically coupled to a common load for current sharing operation. The structure and operation of the a synchronous gate timing drive control and pulse width modulation (PWM) block 112 can take any existing form, and is not a subject of this application, so is not described in further detail.

The power converter 100 includes an oscillator ramp generation block 114, also interchangeably referred to herein and in the claims as oscillator or oscillator circuit 114. The oscillator ramp generation block 114 generates an oscillating ramp signal and provides the oscillating ramp signal to the synchronous gate timing drive control and pulse width modulation block 112. Advantageously, the oscillator ramp generation block 114 may be selectively synchronized to an external source over a wide frequency range. The oscillator ramp generation block 114 may receive a synchronization signal via a synchronization input terminal SYNC IN, to synchronize operation with one or more other power converters or other devices or systems, for example a clock of a system in which power converter 100 is installed. Such synchronization may advantageously reduce overall system noise. The oscillator ramp generation block 114 may advantageously take a form that provides for external slope modulation of the ramp signal, a wider temperature range and/or an ultra wide synchronous frequency range as compared to existing oscillator ramp generation circuits. The oscillator ramp generation block 114 may additionally, or alternatively, take a form that advantageously employs less complex types of components and/or is less expensive to produce as compared to existing oscillator ramp generation circuits. The structure and operation of exemplary embodiments of the oscillator ramp generation block 114 are described in detail herein with reference to FIGS. 2-7.

At a high level, the power converter 100 utilizes an inner current control loop and an outer voltage control loop. The inner current control loop is implemented via a current sense block 116, a current limiting/current sharing (CL/CS) resistor network 118, a 1-D (one minus duty cycle) compensation block 120 and a current control amplifier 122. The outer voltage control loop is implemented by a voltage sense resistor divider network 124 (e.g., resistor Rfb coupled between voltage output terminal +VOUT and sense terminal SENSE, divider resistors Rd, Rc, and trim resistors Rb, Ra coupled to trim terminals TRIMB, TRIMA, respectively) and a voltage error amplifier 126 which feeds the CL/CS resistor network 118 to ultimately control the output voltage of the power converter 100.

With respect to the inner current control loop, the current sense block 116 implements current sensing over a portion of a cycle of the power converter 100, for example over the ON or CLOSED portion of one of the switches $T_1$, $T_2$. The current sense block 116 provides a signal to the CL/CS resistor divider network 118 to control the current control amplifier 122, which signal is indicative of the sensed current. For example, the current sense block 116 may sense current over each portion of a cycle during which portion the low side switch T2 is ON or CLOSED (i.e., conducting), electrically coupling the output inductor $L_{out}$ to ground GND, while neglecting those portions of the cycle when the low side switch T2 is OFF or OPEN.

Where the output current of the synchronous buck converter circuit in the power converter 100 is sensed at the low side switch (e.g., MOSFET synchronous switch) $T_2$, the average of this sensed current is equal to Io*(1-D), where D is defined as the duty cycle of the high side switch (e.g., MOSFET) $T_1$. Since this signal is dependent on the duty cycle and negative in value, a compensation signal that is a direct function of the duty cycle is scaled via the 1-D compensation block 120, and summed with the sensed current signal by the CL/CS resistor network 118. The resultant signal is optionally level shifted in the CL/CS resistor network 118 to create a level shifted compensated signal. The level shifted compensated signal may then be averaged by the current control amplifier 122, and the averaged signal used to control the output current of the power converter 100.

The current control amplifier 122 generates control signals based at least on the level shifted compensated signals from the CL/CS resistor divider network 117 to control the synchronous gate timing drive control and pulse width modulation block 112.

With respect to the inner current control loop, the voltage sense resistor network 124 (e.g., resistor Rfb coupled between voltage output terminal +VOUT and sense terminal SENSE, divider resistors Rd, Rc, and trim resistors Rb, Ra coupled to trim terminals TRIMB, TRIMA, respectively) senses voltage or potential at the output terminal +VOUT with respect to the ground terminal VOUT COM. The voltage sense resistor network 124 supplies a signal indicative of the sensed voltage or potential to the voltage sense amplifier 126. The voltage sense amplifier 126 generates a voltage error signal which indicates a difference between the sensed voltage or potential and a reference voltage or potential. Hence, the voltage sense amplifier 126 is interchangeably referred to herein and in the claims as voltage error amplifier 126. The voltage error amplifier 126 provides the voltage error signal to the current control amplifier 122 via the CL/CS resistor divider network 118, for use in generating the control signals supplied to the synchronous gate timing drive control and pulse width modulation block 112 to control output voltage or potential of the power converter 100.

The power converter 100 may optionally include a soft start control block 128. The soft start control block 128 may receive the precision voltage reference signal VREF from the auxiliary power supply and voltage reference generation block 106. The soft start control block 128 may control various soft start characteristics of the power converter 100, for example soft-start time, current limit thresholds, current limit on-time and output voltage or potential level at which control is handed over to a main control loop. The soft start control block 128 may, for example, provide a progressively increasing pulse width, forming a startup voltage ramp which is proportional to a level of a supply voltage VCC, for instance without the need of an external capacitor. The structure and operation of the soft start control block 128 can take any existing form, and is not a subject of this application so is not described in further detail.

The topology illustrated in and described with reference to FIG. 1 is illustrative of only one of the many possible converter topologies which may employ the oscillator ramp generation block 114 described herein. For example, the oscillator ramp generation block 114 may be employed in power converters which use a different converter circuit topology, for instance boost converter, buck converter or fly-back converter topologies. Also for example, the oscillator ramp generation block 114 may be employed in power converters which use a different control topology, for instance a control topology that senses output current over an entire cycle of the waveform without the need for compensation, or which senses current at the high side active switch. Thus, this application, and in particular the claims, should not be limited to the specific topology illustrated in and discussed with reference to FIG. 1 unless expressly stated therein.

FIG. 2 shows the oscillator 114, according to one illustrated embodiment.

The oscillator 114 includes a ramp timing resistor Rramp, timing capacitor Ct, comparator 202, input voltage divider 204 and reset switch S1. The oscillator 114 may include a buffer B1 to buffer an output signal VRAMP to provide drive capability. The input voltage divider 204 is formed of two resistors Rdiv1, Rdiv2 coupled between the input voltage VSW and a ground GND. The input voltage divider 204 produces a signal indicative of, or proportional to, the input voltage VSW. The comparator 202 is coupled to receive the signal indicative of the input voltage VSW from the input voltage divider 204. The comparator 202 is also coupled to receive a signal from the timing capacitor Ct indicative of a voltage or electrical potential thereof. The comparator 202 is further coupled a supply voltage or potential VCC and ground reference or potential GND. The oscillator 114 receives an input voltage or potential VSW at an input voltage input pin, terminal or node 206. The oscillator 114 is guaranteed to start with application of the input voltage or potential VSW at the input voltage input pin, terminal or node 206.

A basic timing sequence of the oscillator 114 includes charging of timing capacitor Ct toward the input voltage or potential VSW. Once the voltage of the timing capacitor Ct reaches the voltage of the input voltage divider 204, the comparator 202 turns ON the reset switch S1, discharging the timing capacitor Ct. The basic timing sequence repeats at a periodic rate or natural or self oscillating frequency of the oscillator 114.

The oscillator 114 also includes synchronization circuitry including a synchronization capacitor Csync, synchronization resistors Rsync1, Rsync2, and steering logic 208. The steering logic may include AND circuitry 210 to implement an AND function or operation and OR circuitry 212 to implement a OR function or operation. The synchronization circuitry may receive a synchronization input signal Sync In at a synchronization signal input pin, terminal or node 214. A first one of the synchronization resistor Rsync 1 is coupled between the input voltage input pin, terminal or node 206 and the synchronization input pin, terminal or node 214. A second one of the synchronization resistor Rsync 2 is between ground and a node 216 between the synchronization capacitor Csync and part of the OR circuitry 212 steering logic 208.

The synchronization input signal Sync In causes the oscillator 114 to synchronize a frequency of the oscillator 114 to a pulse frequency either below or above the self oscillating frequency of the oscillator 114 without synchronization. The oscillator 114 is capable of locking synchronization, for example with a pulse frequency up to 1 Megahertz. Thus, synchronization signal affects the basic timing sequence of the oscillator.

In particular, the AND circuitry 210 and OR circuitry 212 are coupled to cause an early discharge of the timing capacitor Ct in response to the synchronization signal indicating that a higher frequency is required to synchronize (e.g., rising pulse edge), and to delay discharge of the timing capacitor Ct in response to the synchronization signal indicating that a lower frequency is required to synchronize (e.g., logic low). The logic is reflected in Table A, below.

TABLE A

| Sync In | VCT = VSW? | Discharge Ct? | Comment |
|---|---|---|---|
| 0 | 0 | 0 | Not ready for discharge. |
| 0 | 1 | 0 | Delay discharge to decrease frequency |
| ↑ Rising | 0 | 1 | Early discharge to increase frequency |
| 1 | 1 | 1 | On time discharge, maintain frequency |

Figure 3:
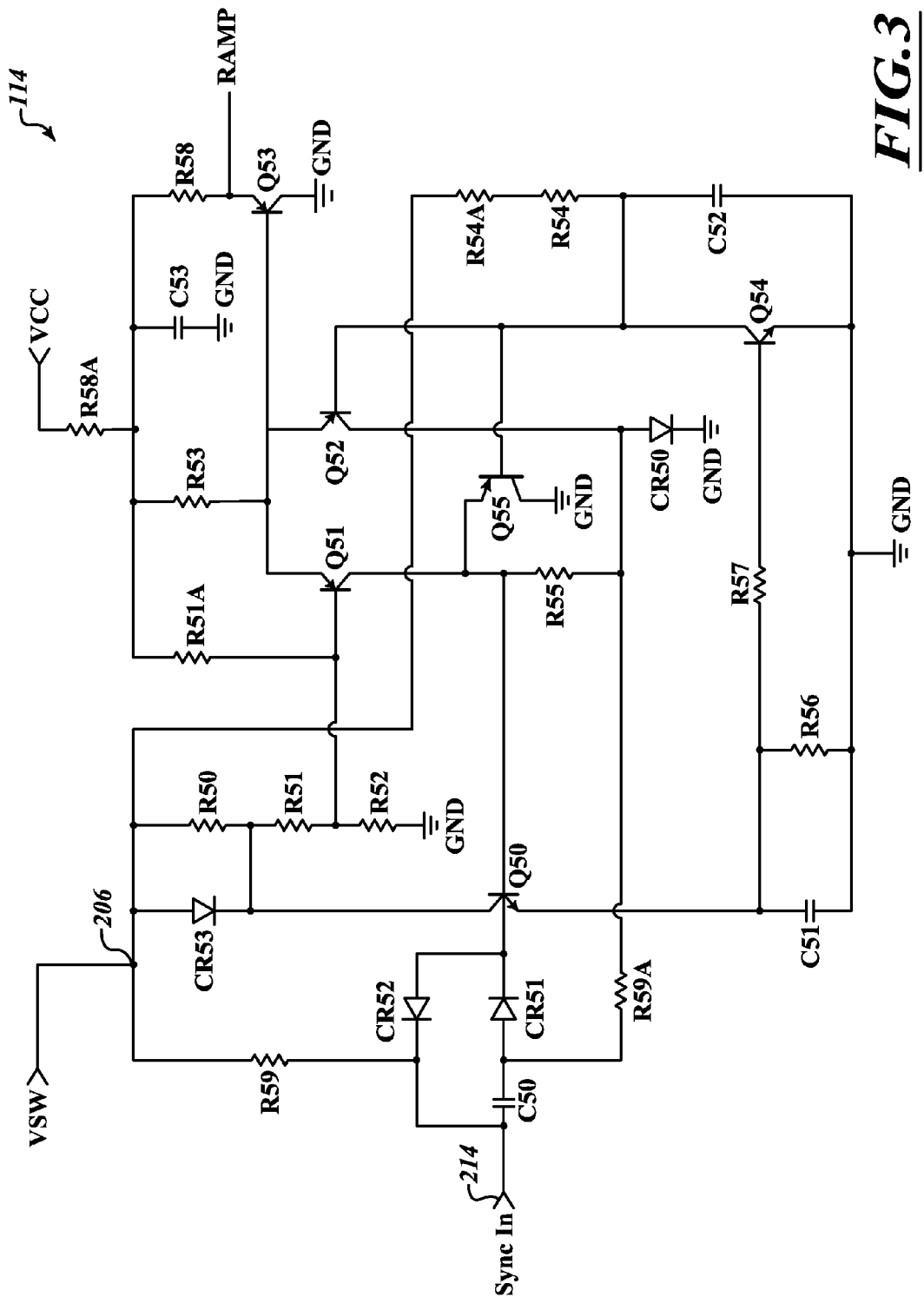
FIG. 3 is a detailed electrical schematic diagram of the oscillator circuit of FIGS. 1 and 2, according to one illustrated embodiment.

FIG. 3 shows the oscillator 114, according to one illustrated embodiment. As illustrated, the oscillator 114 may employ less complex, and less costly discrete semiconductor components, chips resistors and capacitors, than employed by existing oscillators.

A capacitor C52 functions as the timing capacitor Ct (FIG. 2) that is charged through series resistors R54 and R54A which are equivalent to the ramp timing resistance Rramp. The voltage on capacitor C52 initially charges from ground, exponentially toward the input voltage or potential VSW. The comparator 202 (FIG. 2) is formed by a differential pair of transistors (i.e., first comparator transistor Q51 and second comparator transistor Q52), with a base of the second comparator transistor Q52 acting as the non-inverting input and a base of the first comparator transistor Q51 acting as the inverting input. Emitters of the first and the second comparator transistors Q51, Q52 are coupled to a voltage or potential supply VCC via voltage supply resistor R58A and comparator resistor R53. The input voltage divider 204 (FIG. 2) is formed by a pair of resistors R51, R52, which receive the input voltage or potential VSW via resistor R50, and which set a comparison threshold on the base of the first comparator transistor Q51. The basic timing of the oscillator is governed by the following equations:

$$Ts = R*C*\ln[I-F/R(t)-F]$$

$$Fs = 1/Ts$$

where:
I=initial capacitor voltage
F=final capacitor voltage
R(t)=comparator threshold.
If:
F=VSW
R(t)=K·VSW
I=0
Ts=R*C*ln [0−VSW/K·VSW−VSW]
Ts=R*C*ln [1/1−K]

Thus, frequency is not dependent on input voltage VSW.

The timing sequence for the oscillator 114 starts at application of the input voltage or potential VSW, with the timing capacitor C52 charging up to the comparator threshold, at which point the second comparator transistor Q52 turns OFF and the first transistor Q51 turns ON and starts conducting current. This current generates a voltage across a resistor R55 large enough to charge a capacitor C51 via a control transistor Q50 and turn ON a reset or discharge controlling transistor Q54. The current used to charge capacitor C51 flows through the collector of the control transistor Q50 to develop a voltage across diode CR53 and control transistor Q50. This reduces the threshold voltage at the base terminal of transistor Q51 to enhance the transition. The reset or discharge transistor Q54 functions as a voltage clamp that discharges the capacitor C52 to close to zero volts, as this occurs, a discharge termination transistor Q55 removes any residual charge stored at the base node of the control transistor Q50.

A diode CR50 level shifts resistor R55 up one diode junction, reducing the voltage across resistor R55 that is required to turn ON the control transistor Q50, and improving the speed of the overall circuit. Once capacitor C51 discharges through resistor R56 and reset transistor Q54 via a reset resistor R57, the reset transistor Q54 turns OFF, allowing the capacitor C52 to charge again, thereby starting a new timing sequence or cycle.

The buffer amplifier B1 is implemented an emitter follower buffer amplifier by a buffer transistor Q53 and buffer resistor R58, to provide a low source impedance driver capable of driving next stage circuitry. The buffer transistor Q53 is coupled between the buffer transistor Q53 and a ground. The buffer resistor R58 is coupled to a supply voltage or potential VCC and supply voltage resistor R58A, and a ground via a capacitor C53.

The oscillator circuit 114 implements a function whereby a slope of the voltage across capacitor C52 is modulated proportional to a change in the input voltage or potential VSW. In power supply converters, this type of feature is typically referred to as voltage feed-forward, and substantially improves the line regulation performance of the power converter and reduce changes in the output voltage or potential as a result of changes in the input voltage or potential VSW. A power converter without an oscillator that incorporates voltage feed-forward has degraded input line regulation performance since a change in input voltage or potential must propagate to the output of the converter before the feedback control loop can compensate for the input voltage change.

The desired functionality is implemented in the oscillator 114 by making the voltage threshold of the comparator (i.e., Q51, Q52) proportional to the input voltage or potential VSW by tying the resistor R51 of the voltage resistor divider to the input voltage or potential VSW of the power converter. A temperature compensation resistor R51A provides temperature compensation to the VSW derived voltage or potential.

A logic network comprised of synchronization logic resistors R59, R59A, synchronization logic diodes CR52, CR51 and synchronization logic capacitor C50 perform two functions. First, in the case where a frequency of the synchronization signal Sync In is higher than a natural or self frequency of the oscillator circuit 114, a rising pulse at the synchronize input pin, terminal or node 214 will capacitive couple enough charge through synchronization logic capacitor C50 and first synchronization logic diode CR51 to turn on the control transistor Q50 earlier than might be determined by the timing of the capacitor C52. This will terminate the timing charge sequence of the capacitor C52 early, effectively increasing the oscillator frequency of operation. Second, in the case where a frequency of the synchronization signal Sync In is lower than the natural frequency of the oscillator circuit, a low voltage of the pulse at the synchronize input pin, terminal or node 214 through the second synchronization logic diode CR52 will hold off or delay the reset (i.e., discharging) of the capacitor C52, effectively lowering the oscillator frequency of operation.

The illustrated oscillator circuit 114 may be capable of operation up to, for example 1 MHz. Such high speed operation is accomplished via use of a differential transistor pair topology, optimized to minimize all voltage transitions and advantageously employing a minimum number of components.

The above described oscillator designs implement slope modulation, self starting operation, synchronization, wide frequency and wide temperature range of operation. The oscillator design described herein incorporates all these features without the use of complex integrated circuits. Rather, the oscillator design implements all of the desired features with simple, low cost devices while maintaining the desired performance over wide temperature and operating conditions. Designs utilizing complex integrated circuits tend to be more costly, require substantially more parts, and do not appear capable of operating over as wide a frequency range and temperature range.

Figure 4:
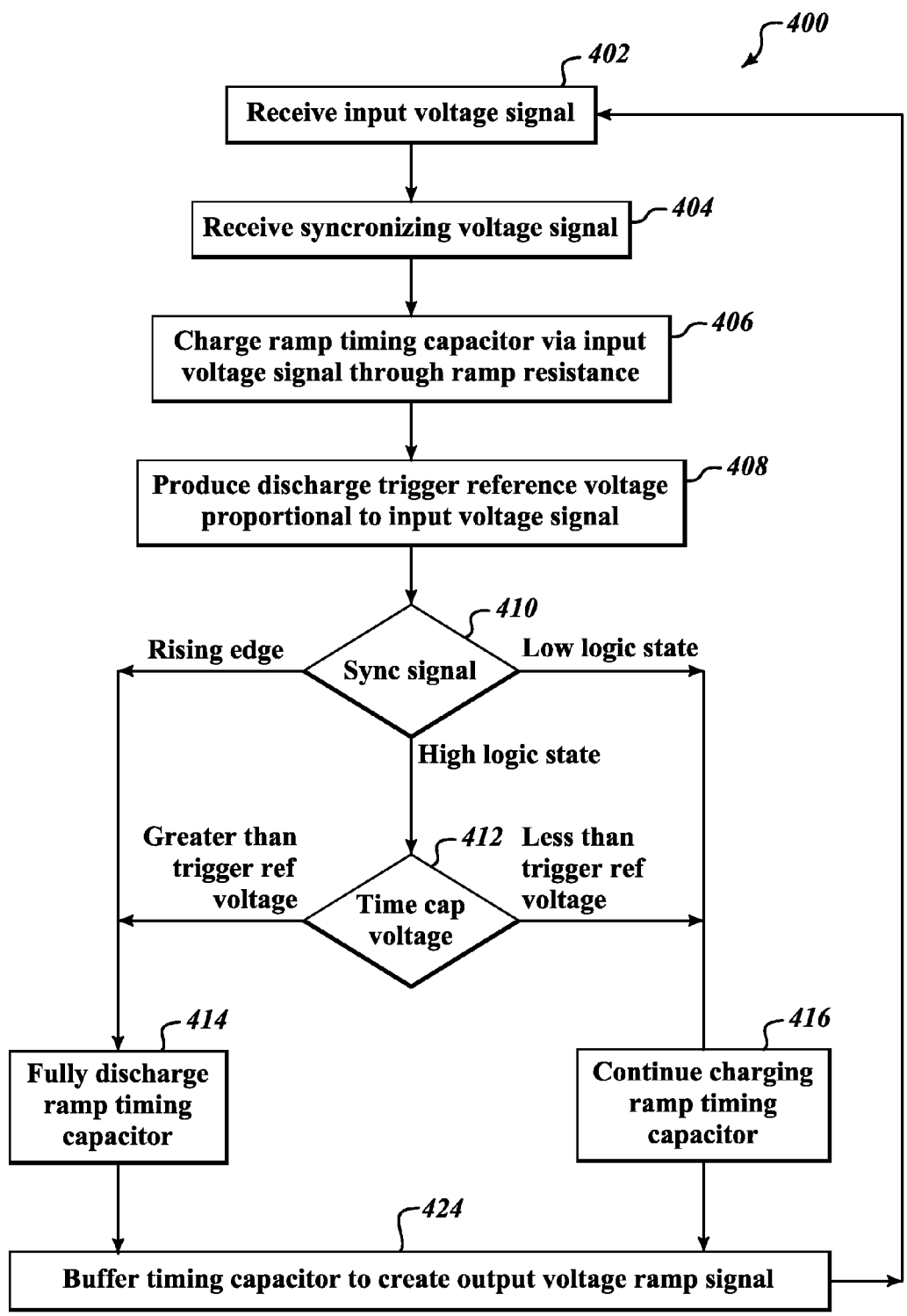
FIG. 4 is a flow diagram of a method of operating the oscillator circuit of FIGS. 1-3, according to one illustrated embodiment.

FIG. 4 shows a flow diagram of a method 400 of operating the oscillator 114 of FIGS. 1-3, according to one illustrated embodiment.

At 402, an oscillator circuit 114 receives an input voltage or potential signal VSW at an input voltage input pin, terminal or node 206. The input voltage or potential signal may be the input voltage or potential supplied to the power converter 100 (FIG. 1) from some upstream component. For example, the input voltage or potential may be supplied to the power converter from a rectifier, a DC/DC converter, an isolating converter stage, and/or a DC electrical power storage device such as an array of chemical battery cells or ultra-capacitors.

At 404, the oscillator circuit 114 receives a synchronizing signal Sync In at a synchronization signal input pin, terminal or node 214. For example, a synchronizing signal Sync In may come from another power converter coupled in parallel with the power converter 100 (FIG. 1) to a common load and operating as either a master or a slave in a current sharing arrangement to supply current to the common load.

At 406, a ramp timing capacitor Ct (FIG. 2), C52 (FIG. 3) is charged through a ramp timing resistance Rramp, R54, R54A using the voltage or potential input VSW.

At 408, a voltage divider 204 (FIG. 2), R51, R52 (FIG. 3) produces a discharge trigger reference voltage. The discharge trigger reference voltage may be proportional to a voltage or potential of the input voltage signal VSW.

At 410, logic circuitry 208 (FIG. 2) determines if a state of a synchronization signal Sync In indicates that frequency needs to be increased, decreased or stay the same. As explained above, a logic network (FIG. 3) comprised of synchronization logic resistors R59, R59A, synchronization logic diodes CR52, CR51 and synchronization logic capacitor C50 may advantageously implement the logic without the need for complicated integrated circuits.

If the synchronization signal Sync In indicates that the frequency needs to be increased (e.g., rising edge), then discharging circuitry fully discharges the ramp timing capacitor Ct (FIG. 2), C52 (FIG. 3) at 414. The discharging circuitry may include switch S1 (FIG. 2) coupled to ground or reset transistor Q54 (FIG. 3) coupled to ground.

If the synchronization signal Sync In indicates that the frequency needs to be decreased (e.g., low logic state), then charging of the ramp timing capacitor Ct (FIG. 2), C52 (FIG. 3) continues at 416. As explained above, such be indicated by a falling pulse applied to the control transistor Q50 (FIG. 3) via synchronization logic diode CR52.

If the synchronization signal Sync In indicates that the frequency should remain the same (e.g., high logic state), then control passes to 412.

At 412, a comparator 202 determines whether a voltage of the ramp timing capacitor Ct (FIG. 2), C52 (FIG. 3) is equal to the discharge trigger reference voltage. As noted, a differential pair of transistors Q51, Q52 (FIG. 3) may be advantageously employed to perform the comparison.

If the voltage of the ramp timing capacitor C52 is equal to the discharge trigger reference voltage, then discharging circuitry fully discharges the ramp timing capacitor Ct (FIG. 2), C52 (FIG. 3) at 414. Otherwise, charging of the ramp timing capacitor Ct (FIG. 2), C52 (FIG. 3) continues at 416.

At 424, a buffer amplifier B1 buffers an output voltage signal VRAMP. As illustrated in FIG. 3, the output voltage signal VRAMP may be buffered by an emitter follower buffer amplifier having a discrete buffer transistor Q53 and buffer resistor R58.

The method 400 may repeat while the power converter 100 is operational, the oscillation circuit 114 continually generating, producing or supplying the oscillation ramp signal VRAMP.

Figure 5:
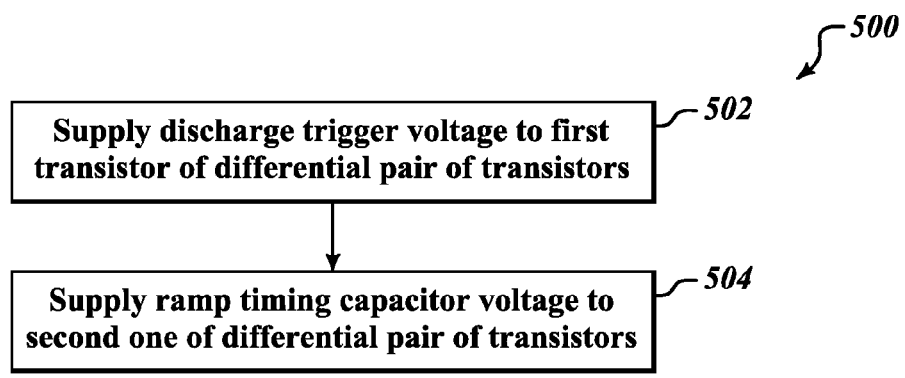
FIG. 5 is a flow diagram of a method of operating the oscillator circuit of FIGS. 1-3, according to one illustrated embodiment, which may be implemented as part of performing the method of FIG. 4.

FIG. 5 shows a method 500 of operating the oscillator 114 of FIGS. 1-3, according to one illustrated embodiment. The method 500 may be implemented as part of performing the method 400 of FIG. 4. In particular, the method 500 specifies how the voltage at the ramp timing capacitor Ct (FIG. 2), C52 (FIG. 3) may be compared to the discharge trigger reference voltage.

At 502, a discharge trigger reference voltage is supplied to a first comparator transistor Q51 of a differential pair of transistors. For example, the supply discharge trigger reference voltage from an input voltage divider R51, R52 (FIG. 3)

may be supplied to a base of the first comparator transistor Q51, which has an emitter commonly coupled with an emitter of a second comparator transistor Q52.

At 504, a voltage across ramp timing capacitor Ct (FIG. 2), C52 (FIG. 3) is supplied to the second comparator transistor Q52 of the differential pair of transistors. For example, the ramp timing capacitor voltage or potential may be supplied to a base of the second comparator transistor Q52.

Figure 6:
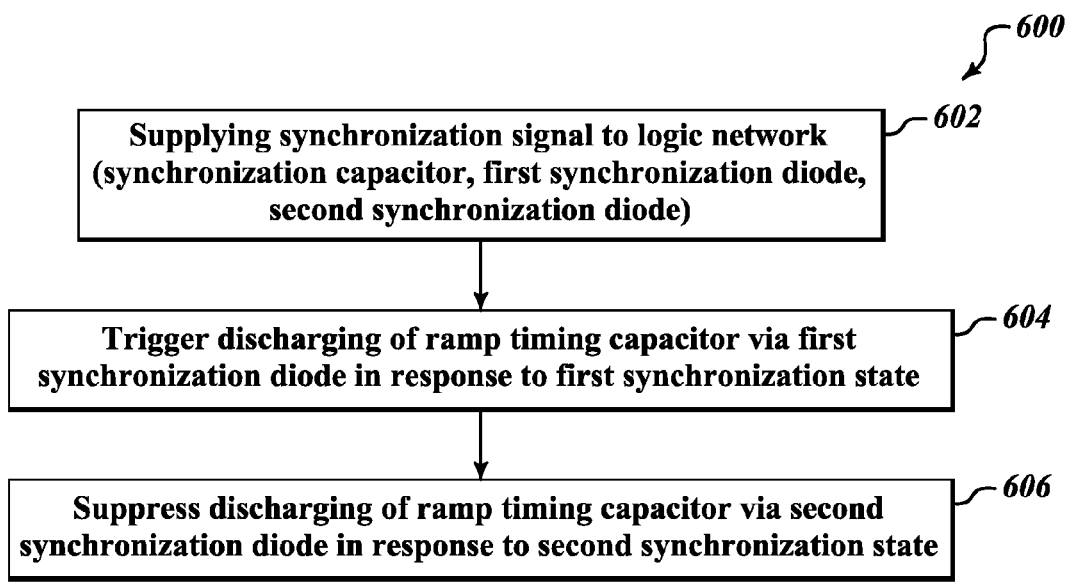
FIG. 6 is a flow diagram of a method of operating the oscillator circuit of FIGS. 1-3, according to one illustrated embodiment, which may be implemented as part of performing the method of FIG. 4.

FIG. 6 shows a method 600 of operating the oscillator 114 of FIGS. 1-3, according to one illustrated embodiment. The method 600 may be implemented as part of performing the method 400 of FIG. 4. The method 600 may determine whether to trigger discharging of the ramp timing capacitor Ct (FIG. 2), C52 (FIG. 3) when the value of the ramp timing capacitor voltage is equal to the discharge trigger reference voltage.

At 602, a synchronization signal Sync In is supplied to a logic network (e.g., synchronization logic resistors R59, R59A, synchronization logic diodes CR52, CR51 and synchronization logic capacitor C50 of FIG. 3).

At 604, discharging of ramp timing capacitor Ct (FIG. 2), C52 (FIG. 3) is triggered via the first synchronization diode CR51 in response to a state of the synchronization signal indicating that frequency needs to be increased (e.g., rising edge of pulse of synchronization signal Sync In).

At 606, discharging of ramp timing capacitor Ct (FIG. 2), C52 (FIG. 3) is suppressed via the second synchronization diode CR52 in response to a state of the synchronization signal indicating that frequency needs to be decreased (e.g., falling edge of pulse of synchronization signal Sync In). Such may be suppressed even though the normal discharging triggering condition of ramp timing capacitor voltage being equal to the discharge trigger reference voltage is satisfied.

Figure 7:
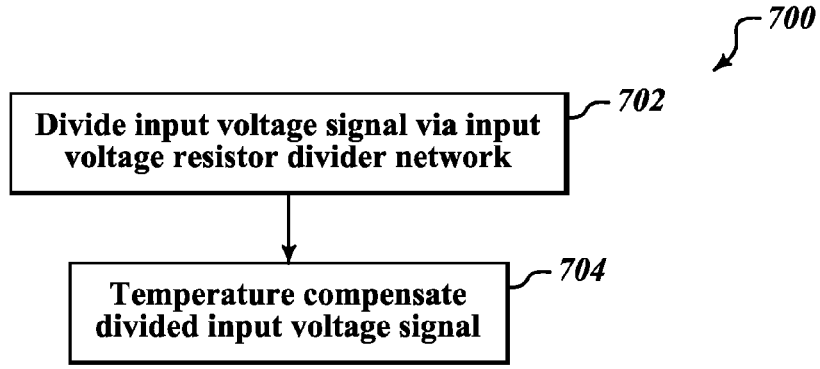
FIG. 7 is a flow diagram of a method of operating the oscillator circuit of FIGS. 1-3, according to one illustrated embodiment, which may be implemented as part of performing the method of FIG. 4.

FIG. 7 shows a method 700 of operating the oscillator 114 of FIGS. 1-3, according to one illustrated embodiment. The method 700 may be implemented as part of performing the method 400 of FIG. 4. For example, the method 700 may be employed to produce, generate or supply a discharge trigger reference voltage that is proportional to a voltage or potential of the input voltage signal.

At 702, an input voltage resistor divider network 204 (FIG. 2) R51, R52 (FIG. 3) divides an input voltage signal VSW to produce a proportional signal.

At 704, a temperature compensation resistor R51A compensates the divided input voltage signal for variations in temperature.

The described oscillator circuit 114 may provide an oscillating ramp signal where a slope of the ramp is modulated in response to an externally applied signal. Such may have linearity over a wide range of operating frequencies and/or temperatures. The described oscillator circuit 114 may allow synchronization with an externally applied synchronization signal. Such may be advantageously implemented using relatively simple and inexpensive components.

While described above in the environment of a power converter, and in particular a switch mode DC/DC synchronous buck power converter, the oscillator circuitry may be advantageously employed in a large variety of other environments. Such may include other types of DC/DC power converters (e.g., boost, buck-boost, flyback), whether isolated or non-isolated. Such may also include other types of power converters, including inverters (DC/AC). Such may also include many other types of non-power converter environments, which employ an oscillating ramp signal, for example to generate, produce or supply PWM signals to various types of devices.

For example, the oscillator and voltage ramp generator may be employed in a simple buck converter topology.

A converter switch of the buck converter may be operable to selectively couple an inductor of the buck converter to the input voltage VIN and a ground reference via a ground diode.

The converter switch may be controlled by the output of a pulse width modulator ramp comparator. The pulse width modulator ramp comparator receives a ramp voltage $V_{Ramp}$ from the oscillator and voltage ramp generator on a positive or non-inverting input pin. The pulse width modulator ramp comparator receives a control signal $V_{control}$ on a negative or inverting pin, from an output of an error voltage integrator control amplifier.

The error voltage integrator control amplifier receives a reference voltage VREF on a positive or non-inverting pin. The error voltage integrator control amplifier receives a signal indicative of an output voltage on a negative or inverting pin thereof via an integration resistor $R_I$. An integrator feedback capacitor $C_F$ and resistor $R_F$ feeds the output (i.e., $V_{control}$) of the error voltage integrator control amplifier back to the negative pin thereof.

Thus, the difference between the reference voltage VREF and the output voltage VOUT is applied to the error voltage integrator control amplifier. This circuit comprised of integration resistor R1, feedback resistor RF, feedback capacitor CF and the amplifier creates the time averaged control voltage VControl, which represents the drive energy required to maintain a desired output voltage VOUT. The control voltage VControl is applied along with the ramp voltage VRamp from the oscillator and voltage ramp generator to the pulse width modulator ramp comparator to create a pulse width modulation signal used to control a state of converter switch (e.g., transistor). The pulsed ON time of converter switch provides an average current that is translated to a continuous output voltage VOUT via an output filter circuit comprised of the diode, the inductor and a load capacitor $C_{Load}$. The output node VOUT is used to supply power to loads requiring a fixed DC output voltage.

With the output voltage VOUT maintaining a constant DC voltage and for any given DC load connected to the output terminal VOUT, it is desirable to maintain a relatively constant control signal $V_{control}$ independent of the applied input voltage VIN.

The oscillator and voltage ramp generator samples the input voltage VIN to modulate the rate of the ramp voltage (dV/dT) proportionally to the input voltage VIN, while at the same time maintaining a fixed frequency. The increased rate (dV/dT) of the ramp voltage VRamp causes the output to reach the control $V_{control}$ comparison more quickly, forcing the pulse width modulator ramp comparator to reduce an average ON time of the converter switch at the fixed PWM frequency.

The specific values, such as specific voltages or potentials, used herein are purely illustrative, and are not meant to be in anyway limiting on the scope. Likewise, the arrangements and topologies are merely illustrative and other arrangements and topologies may be employed where consistent with the teachings herein. While specific circuit structures are disclosed, other arrangements that achieve similar functionality may be employed. The terms switched mode and switch mode are used interchangeable herein and in the claims.

The methods illustrated and described herein may include additional acts and/or may omit some acts. The methods illustrated and described herein may perform the acts in a different order. Some of the acts may be performed sequentially, while some acts may be performed concurrently with other acts. Some acts may be merged into a single act through the use of appropriate circuitry.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to commonly assigned U.S. patent applications:

Ser. No. 13/185,142, titled "POWER CONVERTER APPARATUS AND METHOD WITH COMPENSATION FOR LIGHT LOAD CONDITIONS";

Ser. No. 13/185,217, titled "SELF SYNCHRONIZING POWER CONVERTER APPARATUS AND METHOD SUITABLE FOR AUXILIARY BIAS FOR DYNAMIC LOAD APPLICATIONS";

Ser. No. 13/185,210, titled "INPUT CONTROL APPARATUS AND METHOD WITH INRUSH CURRENT, UNDER AND OVER VOLTAGE HANDLING";

Ser. No. 13/185,172, titled "POWER CONVERTER APPARATUS AND METHOD WITH COMPENSATION FOR CURRENT LIMIT/CURRENT SHARE OPERATION"; and Ser. No. 61/508,937, titled "POWER CONVERTER APPARATUS AND METHODS";

all filed on Jul. 18, 2011, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An oscillator, comprising:
    a voltage input terminal to receive an input voltage signal;
    a synchronizing signal input terminal to receive a synchronizing signal;
    a ramp timing resistance;
    a ramp timing capacitor which is charged by the input voltage signal through the ramp timing resistance;
    an input voltage resistor divider network coupled to the voltage input terminal and which produces a discharge trigger reference voltage that is proportional to a voltage of the input voltage signal;
    a comparator that compares a voltage across the ramp timing capacitor to the discharge trigger reference voltage;
    a logic circuit that in response to a first state of a synchronization signal, discharges the ramp timing capacitor and that in response to a second state of the synchronization signal when the value of the voltage across the ramp timing capacitor is equal to the discharge trigger reference voltage, delays a discharging of the ramp timing capacitor, wherein at least the comparator and the logic circuit are each formed of a number of discrete semiconductor components;
    a control transistor;
    a discharge controlling capacitor;
    a discharge termination transistor; and
    a discharge controlling transistor, the control transistor responsive to at least an output of the comparator to selectively charge the discharge controlling capacitor from the voltage input terminal, the discharge controlling capacitor coupled to selectively cause the discharge controlling transistor and the discharge termination transistor to discharge the ramp timing capacitor.

2. The oscillator of claim 1 wherein the input voltage resistor divider network includes a first divider resistor and a second divider resistor, the input voltage resistor network coupled to provide the discharge trigger reference voltage to the comparator.

3. The oscillator of claim 2 wherein the input voltage resistor divider network further includes a temperature compensation resistor to compensate the discharge trigger reference voltage for temperature variation.

4. The oscillator of claim 2 wherein the comparator comprises a first comparator transistor and a second comparator transistor coupled as a differential pair of transistors, with a base of the first comparator transistor coupled as an inverting input to the input voltage resistor divider network to receive the discharge trigger reference voltage and a base of the second comparator transistor coupled as a non-inverting input to the ramp timing capacitor to receive the voltage across the ramp timing capacitor.

5. The oscillator of claim 1 wherein the comparator comprises a first comparator transistor and a second comparator transistor coupled as a differential pair of transistors.

6. The oscillator of claim 1 wherein the discharge controlling transistor selectively provides a path to a ground to at least approximately fully discharge the ramp timing capacitor to at least close to a zero voltage.

7. The oscillator of claim 6 wherein the logic circuit includes: a synchronization capacitor coupled to the synchronization input terminal to receive the synchronization signal, a first diode coupled to cause the control transistor to be in a first state in response to a first state of the synchronization signal and a second diode coupled to the control transistor cause the control transistor to be in a second state in response to a second state of the synchronization signal.

8. The oscillator of claim 7, further comprising:
    a level shifting diode electrically coupling a control transistor resistor to a ground to level shift the control transistor resistor reducing a voltage required to turn on the control transistor.

9. The oscillator of claim 1 wherein the ramp timing resistance comprises a first ramp resistor and a second ramp resistor electrically coupled in series with the first ramp resistor between the voltage input terminal and the ramp timing capacitor.

10. The oscillator of claim 1, further comprising: a buffer transistor; and a buffer resistor, the buffer transistor and the buffer resistor coupled to form an emitter follower buffer amplifier between a voltage supply and a ground to provide a low source impedance driver.

11. The oscillator of claim 1 wherein at least the ramp timing resistance and the ramp timing capacitor are formed as discrete components on a separate chip from the comparator and the logic circuit.

12. A method of operating an oscillator, the method comprising:
    receiving an input voltage signal at a voltage input terminal;
    receiving a synchronizing signal at a synchronizing signal input terminal;
    charging a ramp timing capacitor via the input voltage signal through a ramp timing resistance;
    producing a discharge trigger reference voltage that is proportional to a voltage of the input voltage signal;

comparing a voltage across the ramp timing capacitor to the discharge trigger reference voltage, wherein comparing the voltage across the ramp timing capacitor to the discharge trigger reference voltage includes supplying the discharge trigger reference voltage to a first transistor of a differential pair of transistors and supplying the voltage across the ramp timing capacitor to a second transistor of the differential pair of transistors;

determining whether to trigger discharging of the ramp timing capacitor when the value of the voltage across the ramp timing capacitor is equal to the discharge trigger reference voltage, wherein determining whether to trigger discharging of the ramp timing capacitor when the value of the voltage across the ramp timing capacitor is equal to the discharge trigger reference voltage includes supplying the synchronization signal to a logic network comprising a synchronization capacitor, a first synchronization diode and a second synchronization diode, triggering the discharging of the ramp timing capacitor via the first synchronization diode in response to a first synchronization state and suppressing triggering of the discharging of the ramp timing capacitor via the second synchronization diode in response to a second synchronization state;

in response to a value of the voltage across the ramp timing capacitor being equal to the discharge trigger reference voltage, discharging the ramp timing capacitor if a state of the synchronization signal indicates synchronization and delaying discharging of the ramp timing capacitor if the state of the synchronization signal does not indicate synchronization; and in response to the state of the synchronization signal indicating synchronization while the voltage across the ramp timing capacitor is less than the discharge trigger reference voltage, discharging the ramp timing capacitor.

13. The method of claim 12, further comprising:
buffering an output voltage signal via a buffer amplifier.

14. The method of claim 13 wherein the buffering the output voltage signal via the buffer amplifier includes buffering the output voltage signal via an emitter follower buffer amplifier having a discrete transistor and resistor.

15. The method of claim 12 wherein the producing the discharge trigger reference voltage that is proportional to the voltage of the input voltage signal includes dividing the input voltage signal via an input voltage resistor divider network and temperature compensating the divided input voltage signal.

* * * * *